US012592550B2

(12) United States Patent
Feng et al.

(10) Patent No.: US 12,592,550 B2
(45) Date of Patent: Mar. 31, 2026

(54) HEAT DISSIPATION STRUCTURE, HIGH-VOLTAGE DISTRIBUTION BOX, BATTERY, AND ELECTRICAL DEVICE

(71) Applicant: CONTEMPORARY AMPEREX TECHNOLOGY (HONG KONG) LIMITED, Hong Kong (HK)

(72) Inventors: Chicheng Feng, Ningde (CN); Chenling Zheng, Ningde (CN)

(73) Assignee: CONTEMPORARY AMPEREX TECHNOLOGY (HONG KONG) LIMITED, Hong Kong (CN)

( * ) Notice: Subject to any disclaimer, the term of this patent is extended or adjusted under 35 U.S.C. 154(b) by 250 days.

(21) Appl. No.: 18/586,349

(22) Filed: Feb. 23, 2024

(65) Prior Publication Data

US 2024/0195155 A1     Jun. 13, 2024

Related U.S. Application Data

(63) Continuation of application No. PCT/CN2023/074132, filed on Feb. 1, 2023.

(30) Foreign Application Priority Data

Mar. 28, 2022    (CN) .......................... 202220694452.4

(51) Int. Cl.
*H02B 1/56* (2006.01)
*H01M 10/613* (2014.01)
(Continued)

(52) U.S. Cl.
CPC ............ *H02B 1/56* (2013.01); *H01M 10/613* (2015.04); *H01M 10/625* (2015.04);
(Continued)

(58) Field of Classification Search
CPC ...... H02G 3/16; H02G 3/081; B60R 16/0238; B60R 16/0239; B60R 16/023;
(Continued)

(56) References Cited

U.S. PATENT DOCUMENTS 7,951,477 B2     5/2011 Wood et al.
9,673,491 B2     6/2017 Fabian et al.
(Continued)

FOREIGN PATENT DOCUMENTS

CN          210926231 U      7/2020
CN          211719732 U      10/2020
(Continued)

OTHER PUBLICATIONS

The European Patent Office (EPO) The Extended European Search Report for Application No. 23777623.2 Dec. 20, 2024 9 Pages.
(Continued)

*Primary Examiner* — Michael A Matey
(74) *Attorney, Agent, or Firm* — ANOVA LAW GROUP, PLLC

(57) ABSTRACT

A heat dissipation structure includes a housing configured to form an accommodation cavity and a heat source disposed in the accommodation cavity. The heat source includes a heat dissipation surface, and the heat source includes a first connecting portion. The heat dissipation structure further includes a heat transfer block inserted in the housing and including at least one surface exposed outside the housing, a first heat transfer surface, and a second connecting portion. The first connecting portion is connected to the second connecting portion directly or through a connecting piece so that the first heat transfer surface keeps in close fit with the heat dissipation surface.

15 Claims, 6 Drawing Sheets

(51) Int. Cl.
 *H01M 10/625*  (2014.01)
 *H01M 10/6551*  (2014.01)
 *H05K 7/20*  (2006.01)

(52) U.S. Cl.
 CPC .... *H01M 10/6551* (2015.04); *H05K 7/20854*
  (2013.01); *H01M 2220/20* (2013.01); *H05K*
           *7/2039* (2013.01)

(58) Field of Classification Search
 CPC ......... B60R 16/03; Y02E 10/50; Y02E 60/10;
    B60L 50/64; H01H 85/143; H01H
    85/175; H01R 11/12; H01R 11/287;
    H01R 13/684; H01R 4/30; H01R 4/363;
    H02S 40/345; H05K 1/0263; H05K 1/18;
    H05K 2201/10939; H05K 5/0069; H05K
    5/02; H05K 7/026; H05K 7/20; H05K
    7/2039; H05K 7/20845; H05K 7/20854;
    Y10S 439/949; H02B 1/56; H01M
    10/613; H01M 10/625; H01M 10/6551;
            H01M 2220/20
 See application file for complete search history.

(56)     References Cited

U.S. PATENT DOCUMENTS

| | | | | |
|---|---|---|---|---|
| 2003/0206392 A1* | 11/2003 | Kawata | .................. | H05K 7/209 |
| | | | | 361/631 |
| 2008/0278918 A1* | 11/2008 | Tominaga | .......... | H05K 7/20854 |
| | | | | 361/719 |
| 2010/0051311 A1* | 3/2010 | Nakagawa | ........... | H01R 11/287 |
| | | | | 174/59 |
| 2012/0248594 A1* | 10/2012 | Lee | ........................ | H01L 23/291 |
| | | | | 438/122 |
| 2014/0242438 A1* | 8/2014 | Tanaka | ................ | H01M 50/224 |
| | | | | 429/185 |
| 2016/0150655 A1* | 5/2016 | Takenaka | ............. | H05K 5/0056 |
| | | | | 361/709 |
| 2018/0006441 A1* | 1/2018 | Sumida | .............. | H05K 7/20418 |
| 2019/0123539 A1* | 4/2019 | Tahara | ................ | B60R 16/0239 |
| 2020/0066472 A1* | 2/2020 | Haraguchi | ........... | H01H 85/143 |
| 2021/0029846 A1 | 1/2021 | Revankar et al. | | |
| 2021/0068299 A1* | 3/2021 | Haraguchi | ......... | H05K 7/14322 |
| 2022/0200255 A1* | 6/2022 | Andrei | ............... | H05K 7/20854 |

FOREIGN PATENT DOCUMENTS

| | | |
|---|---|---|
| CN | 214381991 U | 10/2021 |
| CN | 217159335 U | 8/2022 |
| WO | 2021213780 A1 | 10/2021 |

OTHER PUBLICATIONS

State Intellectual Property Office of China Notice of Grant of Invention Patent Right for Application No. 202220694452.4 Jun. 22, 2022 2 pages (including translation).
The World Intellectual Property Organization (WIPO) International Search Report and Written Opinion for PCT/CN2023/074132 May 18, 2023 13 Pages (including translation).

* cited by examiner

100

20

10

HEAT DISSIPATION STRUCTURE, HIGH-VOLTAGE DISTRIBUTION BOX, BATTERY, AND ELECTRICAL DEVICE

CROSS-REFERENCE TO RELATED APPLICATIONS

This application is a continuation of International Application No. PCT/CN2023/074132, filed on Feb. 1, 2023, which claims priority to Chinese Patent Application No. 202220694452.4, filed on Mar. 28, 2022 and entitled "HEAT DISSIPATION STRUCTURE, HIGH-VOLTAGE DISTRI-BUTION BOX, BATTERY, AND ELECTRICAL DEVICE", the entire contents of both of which are incorporated herein by reference.

TECHNICAL FIELD

This application relates to the technical field of batteries, and in particular, to a heat dissipation structure, a high-voltage distribution box, a battery, and an electrical device.

BACKGROUND

Currently, a battery pack of a new energy vehicle is one of the most critical components imposing the highest safety requirement in a vehicle. A high-voltage distribution box is a high-voltage power distribution unit in a high-voltage system solution of the new energy vehicle. As a core component of a battery control system, the high-voltage distribution box plays a vital role for the safety of the battery pack and the new energy vehicle.

The high current imposes a relatively high heat dissipation requirement in the high-voltage distribution box of an electric vehicle. When the heat dissipation inside the high-voltage distribution box is inefficient, operation in such an environment for a long time impairs the service life of components such as a relay and a fuse, impairs the safety of the battery, and poses enormous safety hazards.

SUMMARY

In view of the above problem, this application provides a heat dissipation structure to improve a heat dissipation capacity and heat dissipation efficiency of a heat source and the nearby region.

According to a first aspect, this application provides a heat dissipation structure. The heat dissipation structure includes: a housing, configured to form an accommodation cavity; a heat source, where the heat source is disposed in the accommodation cavity, the heat source includes a heat dissipation surface, and the heat source includes a first connecting portion; a heat transfer block, where the heat transfer block is inserted in the housing, the heat transfer block includes at least one surface exposed outside the housing, the heat transfer block includes a first heat transfer surface, and the heat transfer block includes a second connecting portion. The first connecting portion is connected to the second connecting portion directly or through a connecting piece so that the first heat transfer surface keeps in close fit with the heat dissipation surface.

In the technical solution of an embodiment of this application, the first heat transfer surface of the heat transfer block of the heat dissipation structure of this application is in close fit with the heat dissipation surface of the heat source. In this way, heat of the heat source is conducted to the heat transfer block, and the heat transfer block can further conduct the heat out of the accommodation cavity in the housing through at least one surface of the heat transfer block, the at least one surface being exposed outside the housing, thereby ensuring a relatively low temperature maintained at the heat source and the nearby region, and in turn, increasing the heat dissipation capacity and heat dissipation efficiency of the heat source and the nearby region. In addition, by means of the first connecting portion, the heat transfer block is connected to the second connecting portion of the heat source directly or through the connecting piece, so as to keep a close fit between the first heat transfer surface and the heat dissipation surface. In this way, the heat of the heat source can be efficiently conducted to the heat transfer block, thereby further increasing the heat dissipation capacity and heat dissipation efficiency of the heat source and the nearby region and reducing the temperature of the heat source and the nearby region.

In some embodiments, the connecting piece passes through the first connecting portion and the second connecting portion sequentially to keep the close fit between the first heat transfer surface and the heat dissipation surface. The connecting piece enables stable connection between the heat source and the heat transfer block. In the above connected state, the first heat transfer surface keeps in close fit with the heat dissipation surface. In this way, the heat of the heat source can be stably and efficiently conducted to the heat transfer block, thereby increasing the heat dissipation capacity and heat dissipation efficiency of the heat source and the nearby region.

In some embodiments, the first connecting portion is a first connecting hole located on the heat dissipation surface. The second connecting portion is a second connecting hole located on the first heat transfer surface. The connecting piece passes through the first connecting hole and the second connecting hole sequentially and is in threaded fit with at least the second connecting hole. Through the threaded fit of the connecting piece, the heat transfer block abuts on the heat source, and the first heat transfer surface keeps in close fit with the heat dissipation surface stably.

In some embodiments, the first connecting portion is a hook structure, and the second connecting portion is a slot structure. The first connecting portion and the second connecting portion are able to be snap-fastened to each other to keep the close fit between the first heat transfer surface and the heat dissipation surface. Stable connection can be implemented between the heat source and the heat transfer block through the snap-fit between the hook structure and the slot structure. In the above connected state, the first heat transfer surface keeps in close fit with the heat dissipation surface. In this way, the heat of the heat source can be stably and efficiently conducted to the heat transfer block, thereby increasing the heat dissipation capacity and heat dissipation efficiency of the heat source and the nearby region.

In some embodiments, the housing includes a wall assembly. The wall assembly wraps around to form a mounting through-hole. The heat transfer block is disposed in the mounting through-hole. The wall assembly is in close fit with an outer wall of the heat transfer block. The wall assembly can limit the position of the heat transfer block, and prevent a displacement of the heat transfer block from affecting the close fit between the first heat transfer surface and the heat dissipation surface, thereby ensuring that the heat of the heat source can be stably and efficiently conducted to the heat transfer block.

In some embodiments, the housing further includes a bottom plate. The wall assembly is disposed protrusively on the bottom plate. The wall assembly is able to partially or fully fit a sidewall of the heat transfer block closely. On the one hand, the close fit can further strengthen the effect of the wall assembly in limiting the position of the heat transfer block. On the other hand, the close fit prevents the heat transfer block from being electrically connected to another electrically conductive component in the accommodation cavity, obstructs the heat transfer block from other components in the accommodation cavity, and prevents the heat from being conducted between the heat transfer block and other components in the accommodation cavity through the sidewall.

In some embodiments, the heat dissipation structure includes two mounting through-holes and two heat transfer blocks. The two heat transfer blocks are disposed in the two mounting through-holes respectively, and the two heat transfer blocks are located at two ends of the heat source respectively. By distributing the two heat transfer blocks at the two ends of the heat source respectively, this application makes it convenient for the two heat transfer blocks to conduct the heat at the two ends of the heat source respectively, and avoids a local high temperature at the heat source and the nearby region, thereby further increasing the heat dissipation capacity and heat dissipation efficiency of the heat source and the nearby region.

In some embodiments, the heat transfer block is a hollow structure. The hollow heat transfer block reduces the weight of the heat dissipation structure and reduces the cost.

In some embodiments, the heat dissipation structure further includes a heat transfer plate. The heat transfer block further includes a second heat transfer surface located outside the accommodation cavity. The second heat transfer surface is in close fit with the heat transfer plate. After the heat of the heat source is conducted to the heat transfer block, the heat transfer block conducts the heat to the heat transfer plate through the second heat transfer surface. In this way, the heat of the heat source is conducted from inside to outside of the accommodation cavity, thereby reducing the temperature at the heat source and the nearby region.

In some embodiments, the heat transfer block is a columnar structure. The first heat transfer surface and the second heat transfer surface are located at two ends of the columnar structure respectively. The heat of the heat source is conducted to one end of the heat transfer block through the heat dissipation surface and the first heat transfer surface. The heat is conducted from one end to the other end of the heat transfer block, and then conducted to the heat transfer plate through the second heat transfer surface.

In some embodiments, a cooling flow channel that allows passage of a cooling liquid is disposed inside the heat transfer plate. After the heat of the heat source is conducted to the heat transfer plate through the heat transfer block, the heat can be exchanged with the cooling liquid in the cooling flow channel to reduce the temperature of the heat transfer plate.

In some embodiments, the heat dissipation structure further includes a deformable heat transfer pad. The heat transfer pad is disposed between the second heat transfer surface and the heat transfer plate. The heat transfer pad ensures a stable fit between the heat transfer block, the second heat transfer surface, and the heat transfer plate, thereby facilitating heat transfer.

According to a second aspect, this application provides a high-voltage distribution box. The high-voltage distribution box includes the heat dissipation structure disclosed in the preceding embodiment. The heat source includes a first electrical connecting piece and a second electrical connecting piece. The first electrical connecting piece is connected to the second electrical connecting piece. The first electrical connecting piece includes the heat dissipation surface.

In the technical solution of an embodiment of this application, a relatively large amount of heat is generated at a region of junction between the first electrical connecting piece and the second electrical connecting piece. Through the close fit between the first heat transfer surface of the heat transfer block and the heat dissipation surface of the first electrical connecting piece, the heat generated at the region of junction between the first electrical connecting piece and the second electrical connecting piece is conducted to the heat transfer block. The heat transfer block further conducts the heat out of the accommodation cavity, thereby reducing the temperature at the region of junction between the first electrical connecting piece and the second electrical connecting piece.

In some embodiments, the second connecting portion is a second connecting hole located on the first heat transfer surface. The first electrical connecting piece includes a third connecting hole. The second electrical connecting piece includes a fourth connecting hole. The connecting piece passes through the fourth connecting hole, the third connecting hole, and the second connecting hole sequentially, and is in threaded fit with at least the second connecting hole so that the first electrical connecting piece, the second electrical connecting piece, and the heat transfer block are connected sequentially. Through the threaded fit of the connecting piece, the second electrical connecting piece abuts on the first electrical connecting piece, the first electrical connecting piece abuts on the heat transfer block, and the first heat transfer surface keeps in close fit with the heat dissipation surface stably.

In some embodiments, the first electrical connecting piece is a fuse, and the second electrical connecting piece is a high-voltage copper busbar. A relatively large amount of heat is generated at the region of junction between the fuse and the high-voltage copper busbar. The heat transfer block can conduct the heat out of the accommodation cavity, thereby reducing the temperature at the region of junction between the fuse and the high-voltage copper busbar.

According to a second aspect, this application provides a battery. The battery includes the high-voltage distribution box disclosed in the preceding embodiment.

According to a third aspect, this application provides an electrical device. The electrical device includes the battery disclosed in the preceding embodiment. The battery is configured to provide electrical energy.

The foregoing description is merely an overview of the technical solutions of this application. Some specific embodiments of this application are described below illustratively to enable a clearer understanding of the technical solutions of this application, enable implementation of the technical solutions based on the subject-matter hereof, and make the foregoing and other objectives, features, and advantages of this application more evident and comprehensible.

BRIEF DESCRIPTION OF DRAWINGS

By reading the following detailed description of exemplary embodiments, a person of ordinary skill in the art becomes clearly aware of various other advantages and benefits. The drawings are merely intended to illustrate the exemplary embodiments, but not to limit this application. In all the drawings, the same reference numeral represents the same component. In the drawings:

5

Figure 1:
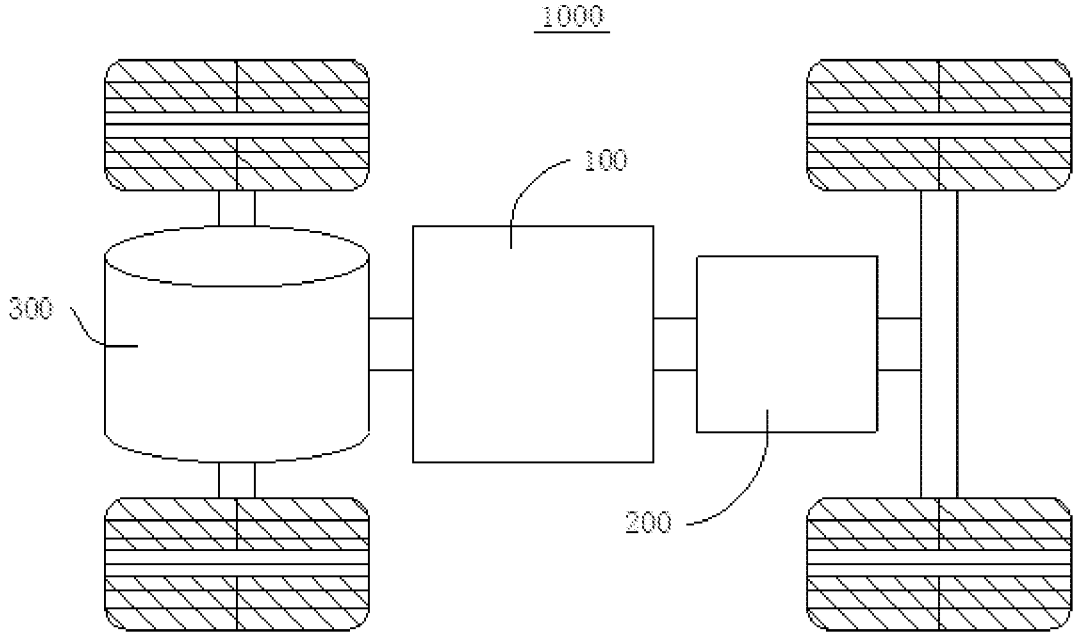
Figure 2:
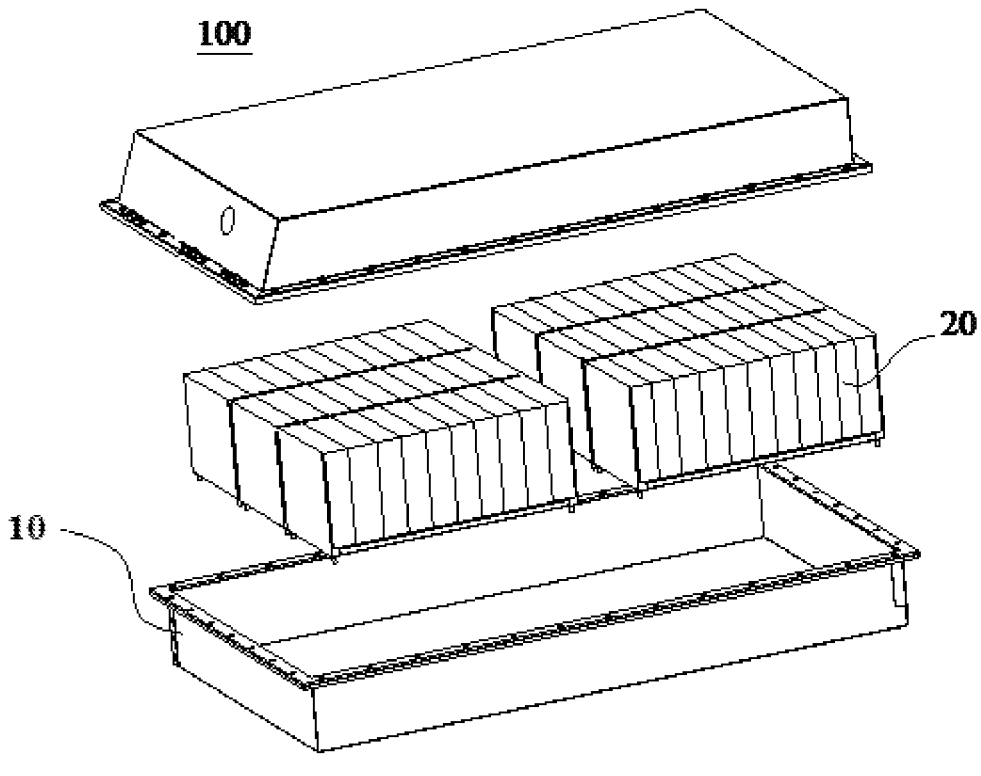
Figure 3:
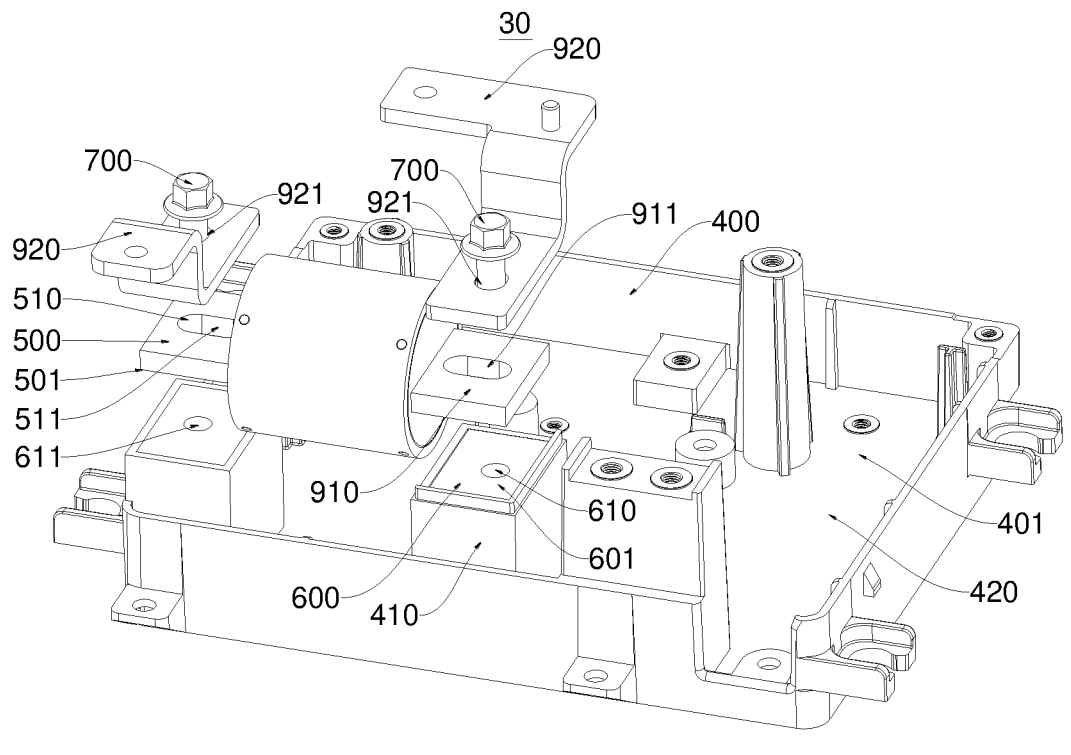
Figure 4:
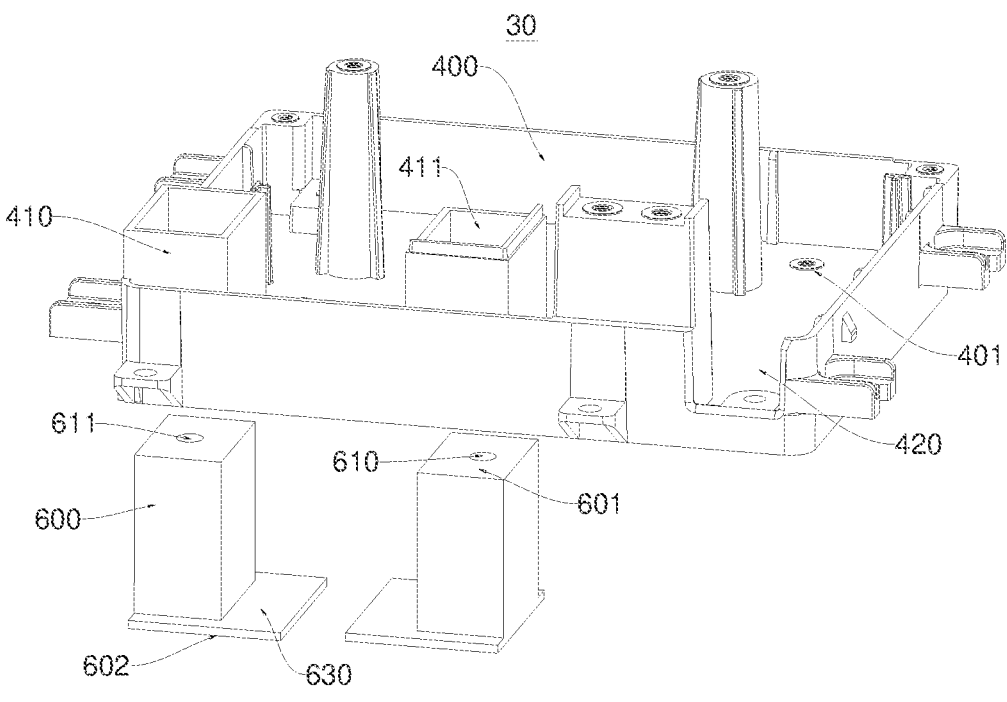
Figure 5:
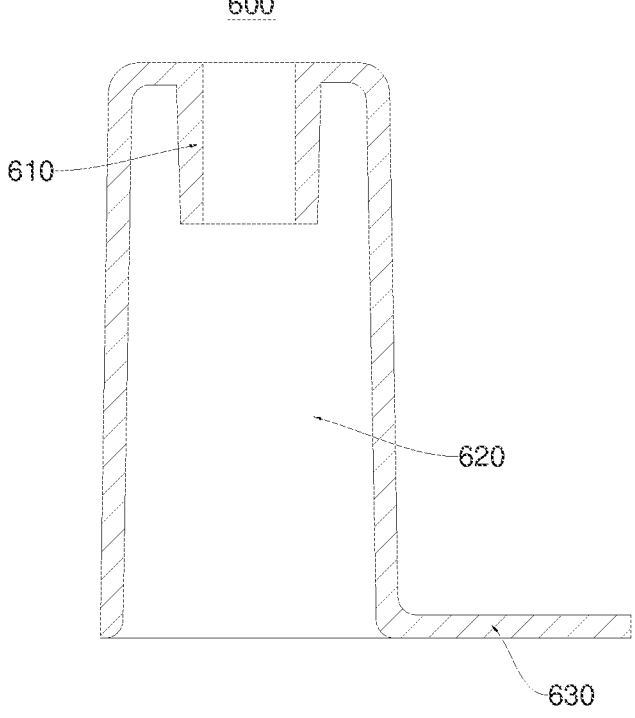
Figure 6:
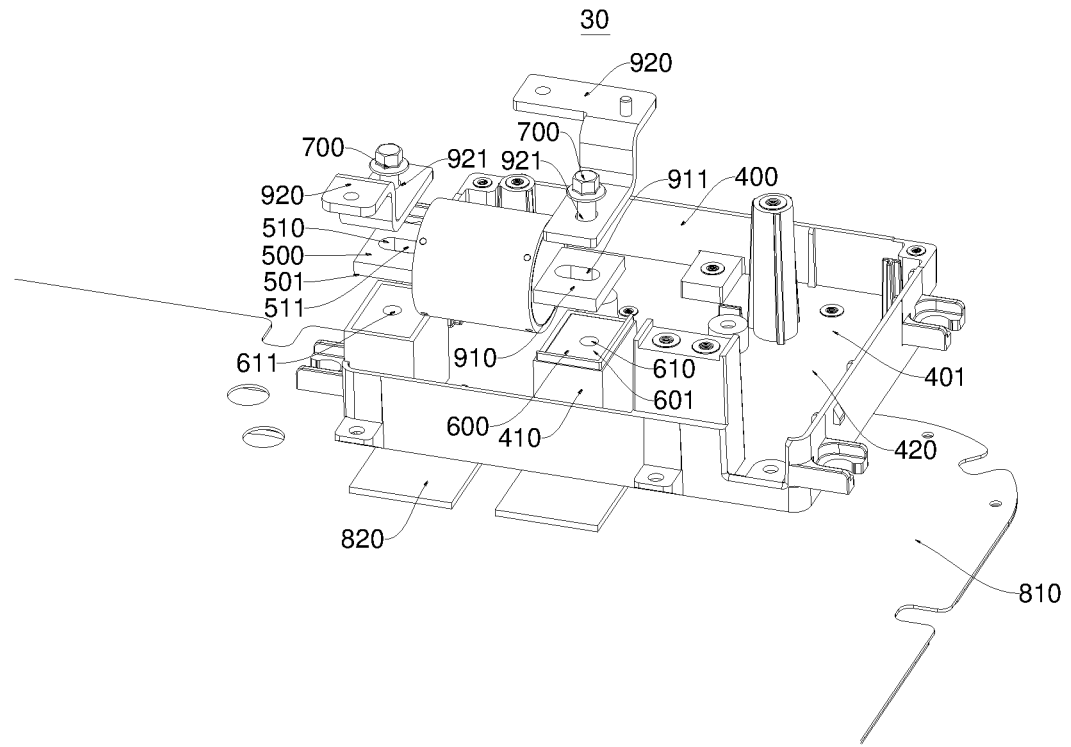

FIG. 1 is a brief schematic diagram of a vehicle according to some embodiments of this application;

FIG. 2 is a schematic structural diagram of a battery in the vehicle shown in FIG. 1;

FIG. 3 is a schematic structural diagram of a heat dissipation structure according to some embodiments of this application;

FIG. 4 is a schematic structural diagram of a heat transfer block before insertion into a housing according to some embodiments of this application;

FIG. 5 is a cross-sectional view of a heat transfer block according to some embodiments of this application; and FIG. 6 is a schematic structural diagram of another heat dissipation structure according to some embodiments of this application.

LIST OF REFERENCE NUMERALS

1000—vehicle;
100—battery; 200—controller; 300—motor;
10—box; 20—battery cell;
30—heat dissipation structure; 400—housing; 401—accommodation cavity; 410—wall assembly; 411—mounting through-hole; 420—bottom plate; 500—heat source; 501—heat dissipation surface; 510—first connecting portion; 511—first connecting hole; 600—heat transfer block; 601—first heat transfer surface; 602—second heat transfer surface; 610—second connecting portion; 611—second connecting hole; 620—hollowed portion; 630—heat exchange portion; 700—connecting piece; 810—heat transfer plate; 820—heat transfer pad; 910—first electrical connecting piece; 911—third connecting hole; 920—second electrical connecting piece; 921—fourth connecting hole.

DETAILED DESCRIPTION OF EMBODIMENTS

Some embodiments of the technical solutions of this application are described in detail below with reference to the drawings. The following embodiments are merely intended as examples to describe the technical solutions of this application more clearly, but not intended to limit the protection scope of this application.

Unless otherwise defined, all technical and scientific terms used herein bear the same meanings as what is normally understood by a person skilled in the technical field of this application. The terms used herein are merely intended to describe specific embodiments but not to limit this application. The terms "include" and "contain" and any variations thereof used in the specification, claims, and brief description of drawings of this application are intended as non-exclusive inclusion.

In the description of the embodiments of this application, the technical terms "first" and "second" are merely intended to distinguish between different items but not intended to indicate or imply relative importance or implicitly specify the number of the indicated technical features, specific order, or order of precedence. In the description of the embodiments of this application, unless otherwise expressly specified, "a plurality of" means two or more.

Reference to an "embodiment" herein means that a specific feature, structure or characteristic described with reference to this embodiment may be included in at least one embodiment of this application. Reference to this term in different places in the specification does not necessarily represent the same embodiment, nor does it represent an independent or alternative embodiment in a mutually exclusive relationship with other embodiments. A person skilled in the art explicitly and implicitly understands that the embodiments described herein may be combined with other embodiments.

In the description of embodiments of this application, the term "and/or" merely indicates a relationship between related items, and represents three possible relationships. For example, "A and/or B" may represent the following three circumstances: A alone, both A and B, and B alone. In addition, the character "/" herein generally indicates an "or" relationship between the item preceding the character and the item following the character.

In the description of embodiments of this application, the term "a plurality of" means two or more (including two). Similarly, "a plurality of groups" means two or more groups (including two groups), and "a plurality of pieces" means two or more pieces (including two pieces).

In the description of embodiments of this application, a direction or a positional relationship indicated by the terms such as "center", "longitudinal", "transverse", "length", "width", "thickness", "up", "down", "before", "after", "left", "right", "vertical", "horizontal", "top", "bottom", "in", "out", "clockwise", "counterclockwise", "axial", "radial", and "circumferential" is a direction or positional relationship based on the illustration in the drawings, and is merely intended for ease or brevity of description of embodiments of this application, but not intended to indicate or imply that the indicated device or component is necessarily located in the specified direction or constructed or operated in the specified direction. Therefore, such terms are not to be understood as a limitation on embodiments of this application.

In the description of the embodiments of this application, unless otherwise expressly specified and defined, the technical terms such as "mounting", "concatenation", "connection", and "fixing" need to be understood in a broad sense, for example, understood as a fixed connection or a detachable connection or integrally formed; or understood as a mechanical connection or an electrical connection; understood as a direct connection, or an indirect connection implemented through an intermediary; or understood as internal communication between two components or interaction between two components. A person of ordinary skill in the art can understand the specific meanings of the terms in the embodiments of this application according to specific situations.

Currently, as can be seen from the market trend, the application of power batteries is increasingly extensive. Power batteries are not only used in energy storage power systems such as hydro, thermal, wind, and solar power stations, but also widely used in electric means of transport such as electric bicycles, electric motorcycles, and electric vehicles, and used in many other fields such as military equipment and aerospace. The market demand for power batteries keeps soaring with the increase of the application fields of the power batteries.

The applicant hereof has noticed that, used as a high-voltage power distribution unit in a high-voltage system solution of a new energy vehicle, a high-voltage distribution box plays a crucial role for the safety of a battery pack and the new energy vehicle. Components in the high-voltage distribution box generally include a fuse, a relay, a current sensor, a pre-charge resistor, and the like. In an existing high-voltage distribution box, a high-temperature region may exist due to a high current in an electrical connecting piece in the high-voltage distribution box. When the heat dissipation inside the high-voltage distribution box is inefficient, operation in such an environment for a long time impairs the service life of components such as the relay and the fuse, impairs the safety of the battery, and poses enormous safety hazards.

To alleviate the problem of a high temperature in a partial or full region of the high-voltage distribution box, the applicant has found through research that a heat dissipation structure may be disposed in the high-voltage distribution box. The heat dissipation structure can conduct heat in the partial or full region of the high-voltage distribution box to other places. In this way, the high-voltage distribution box effectively prevents an overly high temperature in a partial or full region of the high-voltage distribution box.

However, the applicant also finds that the heat dissipation capacity and the heat dissipation efficiency of the heat dissipation structure affect the temperature of the high-voltage distribution box. If the heat dissipation capacity and heat dissipation efficiency of the heat dissipation structure are relatively low or even insufficient to counteract the temperature rise of the high-voltage distribution box, the heat dissipation structure can just alleviate the speed of temperature rise of the high-voltage distribution box, but without fundamentally solving the problem of a high temperature in a partial or full region of the high-voltage distribution box.

In view of the above considerations, to solve the problem of a high temperature in a partial or full region of the high-voltage distribution box, the applicant has designed a heat dissipation structure through in-depth research. In the high-voltage distribution box, a heat transfer block is disposed. The heat transfer block conducts the heat of a heat source out of the high-voltage distribution box. In this way, the heat in a partial or full region of the high-voltage distribution box is conducted out of the high-voltage distribution box, thereby reducing the temperature in the partial or full region of the high-voltage distribution box.

In addition, by means of the first connecting portion, the heat transfer block is connected to the second connecting portion of the heat source directly or through the connecting piece, so as to keep a close fit between the first heat transfer surface and the heat dissipation surface. In this way, the heat of the heat source can be efficiently conducted to the heat transfer block, thereby further increasing the heat dissipation capacity and heat dissipation efficiency of the heat source and the nearby region and reducing the temperature in the partial or full region of the high-voltage distribution box.

The battery mentioned in embodiments of this application means a unitary physical module that includes one or more battery cells to provide a higher voltage and a higher capacity. A battery typically includes a box configured to package one or more battery cells. The box prevents liquid or other foreign matters from affecting the charging or discharging of the battery cells.

A battery cell may include a lithium-ion secondary battery cell, a lithium-ion primary battery cell, a lithium-sulfur battery cell, a sodium-lithium-ion battery cell, a sodium-ion battery cell, a magnesium-ion battery cell, or the like. The type of the battery cell is not limited herein. The battery cell may be in various shapes such as cylindrical, flat, cuboidal or other shapes. The shape of the battery cell is not limited herein. Depending on the form of packaging, battery cells are generally classed into three types: cylindrical battery cell, prismatic battery cell, and pouch-type battery cell.

A battery cell includes an electrode assembly and an electrolyte solution. The electrode assembly includes a positive electrode plate, a negative electrode plate, and a separator. The battery cell works primarily by shuttling metal ions between the positive electrode plate and the negative electrode plate. The positive electrode plate includes a positive current collector and a positive active material layer. A surface of the positive current collector is coated with the positive active material layer. Of the positive current collector, a part uncoated with the positive active material layer protrudes from a part coated with the positive active material layer. The part, uncoated with the positive active material layer, of the positive current collector, serves as a positive tab. Using a lithium-ion battery as an example, the positive current collector may be made of aluminum, and a positive active material may be lithium cobalt oxide, lithium iron phosphate, ternary lithium, lithium manganese oxide, or the like. The negative electrode plate includes a negative current collector and a negative active material layer. A surface of the negative current collector is coated with the negative active material layer. Of the negative current collector, a part uncoated with the negative active material layer protrudes from a part coated with the negative active material layer, and the part uncoated with the negative active material layer serves as a negative tab. The negative current collector may be made of copper, and a negative active material may be carbon, silicon, or the like. To prevent a large electrical current from tripping the circuit, a plurality of positive tabs are stacked together, and a plurality of negative tabs are stacked together. The separator may be made of a material such as polypropylene (polypropylene, PP) or polyethylene (polyethylene, PE). In addition, the electrode assembly may be of a jelly-roll type structure or a stacked type structure, without being limited herein.

The battery cell further includes a current collection component. The current collection component is configured to electrically connect a tab of the battery cell to an electrode terminal, so that electrical energy is transferred from the electrode assembly to the electrode terminal and then transferred out of the battery cell through the electrode terminal. A plurality of battery cells are electrically connected to each other by a busbar component, so as to implement series, parallel, or series-and-parallel connection between the battery cells.

The battery further includes a sampling terminal and a battery management system. The sampling terminal is connected to a busbar component, and is configured to acquire information on the battery cell such as voltage or temperature. The sampling terminal transmits the acquired battery cell information to the battery management system. When detecting that the battery cell information exceeds a normal range, the battery management system limits an output power of the battery to achieve safety protection.

The battery further includes a high-voltage distribution box. The high-voltage distribution box may be mounted inside a battery box or outside the battery box. The high-voltage distribution box is a high-voltage power distribution unit in a high-voltage system solution of a new energy vehicle.

Understandably, the electrical devices that employ the battery disclosed in an embodiment of this application may come in various forms, for example, a mobile phone, a portable device, a notebook computer, an electric power cart, an electric vehicle, a ship, a spacecraft, an electric toy, an electric tool. For example, the spacecraft includes an airplane, a rocket, a space shuttle, a spaceship, and the like. The electric toy includes a fixed or mobile electric toy, such as a game console, an electric car toy, an electric ship toy, an electric airplane toy, and the like. The electric tool includes an electric tool for metal cutting, an electric grinding tool, an electric assembly tool, an electric tool for railways, such as an electric drill, an electric grinder, an electric wrench, an electric screwdriver, an electric hammer, an electric impact drill, a concrete vibrator, or an electric planer.

The battery cell and the battery described in an embodiment of this application are not only applicable to the electrical devices described above, but also applicable to all electrical devices that use a battery cell or a battery. For brevity, however, the following embodiments are described by using an electric vehicle as an example.

FIG. 1 is a brief schematic diagram of a vehicle according to some embodiments of this application, and FIG. 2 is a schematic structural diagram of a battery in the vehicle shown in FIG. 1.

Referring to FIG. 1, a battery 100, a controller 200, and a motor 300 are disposed inside a vehicle 1000. For example, the battery 100 may be disposed at the bottom, front, or rear of the vehicle 1000. The vehicle 1000 may be an oil-fueled vehicle, a natural gas vehicle, or a new energy vehicle. The new energy vehicle may be a battery electric vehicle, a hybrid electric vehicle, a range-extended electric vehicle, or the like.

In some embodiments of this application, the battery 100 may be configured to supply power to the vehicle 1000. For example, the battery 100 may serve as an operating power supply of the vehicle 1000. The controller 200 is configured to control the battery 100 to supply power to the motor 300, for example, to meet electrical energy requirements in starting, navigating, or running the vehicle 1000.

In other embodiments, the battery 100 serves not only as an operating power supply of the vehicle 1000, but may also serve as a drive power supply of the vehicle 1000 to provide driving power for the vehicle 1000 in place of or partly in place of fuel oil or natural gas.

The battery 100 referred to herein means a unitary physical module that includes one or more battery cells 20 to provide a higher voltage and a higher capacity. For example, the battery 100 is formed by connecting a plurality of battery cells 20 in series or in parallel.

Referring to FIG. 2, the battery 100 includes a battery box 10 and a battery cell 20. The battery cell 20 is accommodated in the battery box 10.

The battery 100 may contain a plurality of battery cells 20. The plurality of battery cells 20 may be connected in series, parallel, or series-and-parallel pattern. The series-and-parallel pattern means a combination of series connection and parallel connection of the plurality of battery cells 20. The plurality of battery cells 20 may be directly connected in series, parallel, or series-and-parallel pattern, and then the whole of the plurality of battery cells 20 may be accommodated in the battery box 10. Alternatively, the plurality of battery cells 20 may be connected in series, parallel, or series-and-parallel pattern to form a battery 100 in the form of battery modules first. A plurality of battery modules are then connected in series, parallel, or series-and-parallel pattern to form a whole for being accommodated in the battery box 10. The battery 100 may further include other structures. For example, the battery 100 may further include a busbar component. The busbar component is configured to implement electrical connection between the plurality of battery cells 20.

According to some embodiments of this application, referring to FIG. 3 and FIG. 4, FIG. 3 is a schematic structural diagram of a heat dissipation structure 30 according to some embodiments of this application; and FIG. 4 is a schematic structural diagram of a heat transfer block 600 before insertion into a housing 400 according to some embodiments of this application. This application provides a heat dissipation structure 30, including: a housing 400, a heat source 500, and a heat transfer block 600. The housing 400 is configured to form an accommodation cavity 401. The heat source 500 is disposed in the accommodation cavity 401. The heat source 500 includes a heat dissipation surface 501. The heat source 500 includes a first connecting portion 510. A heat transfer block 600 is inserted in the housing 400 and includes at least one surface exposed outside the housing 400. The heat transfer block 600 includes a first heat transfer surface 601. The heat transfer block 600 includes a second connecting portion 610. The first connecting portion 510 is connected to the second connecting portion 610 directly or through a connecting piece 700 so that the first heat transfer surface 601 keeps in close fit with the heat dissipation surface 501.

The heat source 500 may be any component capable of generating heat. Generally, the temperature of the heat source 500 is higher than the temperature of the nearby components and air. The heat source 500 can diffuse the heat to the nearby components and air by means of thermal radiation, thereby increasing the temperature of the nearby components and air of the heat source 500. In the high-voltage distribution box, the heat source 500 includes a flexible flat cable, a high-voltage copper busbar, a fuse, and the like.

The first connecting portion 510 of the heat source 500 is a structure that enables the heat source 500 to be stably connected to the heat transfer block 600. The first connecting portion 510 may be a structure that is directly connected to the heat transfer block 600 or a structure that is connected to the heat transfer block 600 through a connecting piece 700.

The heat dissipation surface 501 of the heat source 500 is a surface on which the heat source 500 is in close fit with the heat transfer block 600. The heat source 500 can exchange heat with the heat transfer block 600 through the heat dissipation surface 501, thereby conducting the heat to the heat transfer block 600.

The heat transfer block 600 is a component capable of conducting heat rapidly, and is typically made of a material of a relatively high thermal conductivity. For example, the heat transfer block 600 may be made of a simple-substance metal. The simple-substance metals include simple-substance aluminum, simple-substance copper, and the like. The heat transfer block 600 may be in a shape that is regular or irregular. For example, the heat transfer block 600 may be cylindrical or cuboidal.

The second connecting portion 610 of the heat transfer block 600 is a structure that enables the heat transfer block 600 to be stably connected to the heat source 500. The second connecting portion 610 may be a structure that is directly connected to the heat source 500 or a structure that is connected to the heat source 500 through the connecting piece 700.

The first heat transfer surface 601 of the heat transfer block 600 is a surface on which the heat transfer block 600 is in close fit with the heat source 500. The heat transfer block 600 can exchange heat with the heat source 500 through the first heat transfer surface 601, thereby conducting the heat to the heat transfer block 600.

The connecting piece 700 is a structure that connects the first connecting portion 510 and the second connecting portion 610. For example, the connecting piece 700 may be a bolt, a screw, or a connecting pin.

The first heat transfer surface 601 of the heat transfer block 600 of the heat dissipation structure 30 is in close fit with the heat dissipation surface 501 of the heat source 500.

In this way, the heat of the heat source 500 is conducted to the heat transfer block 600, and the heat transfer block 600 can further conduct the heat out of the accommodation cavity 401 in the housing 400 through at least one surface of the heat transfer block, the at least one surface being exposed outside the housing 400, thereby ensuring a relatively low temperature maintained at the heat source 500 and the nearby region, and in turn, increasing the heat dissipation capacity and heat dissipation efficiency of the heat source 500 and the nearby region. In addition, by means of the second connecting portion 610, the heat transfer block 600 is connected to the first connecting portion 510 of the heat source 500 directly or through the connecting piece 700, so as to keep a close fit between the first heat transfer surface 601 and the heat dissipation surface 501. In this way, the heat of the heat source 500 can be efficiently conducted to the heat transfer block 600, thereby further increasing the heat dissipation capacity and heat dissipation efficiency of the heat source 500 and the nearby region and reducing the temperature of the heat source 500 and the nearby region.

Optionally, the first connecting portion 510 is fixedly connected to the second connecting portion 610.

With the heat source 500 being fixedly connected to the heat transfer block 600, in the above connected state, the first heat transfer surface 601 keeps in close fit with the heat dissipation surface 501. In this way, the heat of the heat source 500 can be stably and efficiently conducted to the heat transfer block 600, thereby increasing the heat dissipation capacity and heat dissipation efficiency of the heat source 500 and the nearby region.

The forms of the fixed connection include welding. The forms of welding include laser welding and resistance welding.

In a possible embodiment, optionally, the connecting piece 700 passes through the first connecting portion 510 and the second connecting portion 610 sequentially to keep the close fit between the first heat transfer surface 601 and the heat dissipation surface 501.

The connecting piece 700 enables stable connection between the heat source 500 and the heat transfer block 600. In the above connected state, the first heat transfer surface 601 keeps in close fit with the heat dissipation surface 501. In this way, the heat of the heat source 500 can be stably and efficiently conducted to the heat transfer block 600, thereby increasing the heat dissipation capacity and heat dissipation efficiency of the heat source 500 and the nearby region.

In a possible embodiment, optionally, the first connecting portion 510 is a first connecting hole 511 located on the heat dissipation surface 501. The second connecting portion 610 is a second connecting hole 611 located on the first heat transfer surface 601. The connecting piece 700 passes through the first connecting hole 511 and the second connecting hole 611 sequentially and is in threaded fit with at least the second connecting hole 611.

The first connecting hole 511 is a connecting hole with a diameter equal to or slightly greater than an outer diameter of the connecting piece 700, and is a through-hole running through the heat dissipation surface 501.

The second connecting hole 611 is a connecting hole with a diameter equal to or slightly greater than the outer diameter of the connecting piece 700, and may be a through-hole or slotted hole disposed on the first heat transfer surface 601.

The connecting piece 700 is a structure of which one part is able to pass through the first connecting hole 511 and another part is unable to pass through the first connecting hole 511 or the second connecting hole 611. The part unable to pass through the first connecting hole 511 or the second connecting hole 611 abuts on the heat source 500. The part able to pass through the first connecting hole 511 and the second connecting hole 611 includes an external thread. For example, the connecting piece 700 may be a bolt or a screw.

When the connecting piece 700 is a bolt, the bolt includes a head and a screw rod. The head is unable to pass through the first connecting hole 511 or the second connecting hole 611, and abuts on the heat source 500. The screw rod is able to pass through the first connecting hole 511 and the second connecting hole 611 to implement a threaded fit with at least the second connecting hole 611.

Optionally, the connecting piece 700 is in threaded fit with the second connecting hole 611 alone.

One end of the connecting piece 700 includes an external thread, and the other end of the connecting piece is a smooth surface. An inner wall that forms the first connecting hole 511 is a smooth surface, and an inner wall that forms the second connecting hole 611 includes an internal screw hole that fits the external thread of the connecting piece 700. The diameter of the first connecting hole 511 is slightly greater than the outer diameter of the connecting piece 700, so that an externally threaded end of the connecting piece 700 can pass through the first connecting hole 511.

Optionally, the connecting piece 700 is in threaded fit with both the first connecting hole 511 and the second connecting hole 611.

Both ends of the connecting piece 700 include external threads. Both the inner wall that forms the first connecting hole 511 and the inner wall that forms the second connecting hole 611 include internal screw holes that fit the external thread of the connecting piece 700.

Through the threaded fit of the connecting piece 700, the heat transfer block 600 abuts on the heat source 500, and the first heat transfer surface 601 keeps in close fit with the heat dissipation surface 501 stably.

In a possible embodiment, optionally, the first connecting portion 510 is a hook structure, and the second connecting portion 610 is a slot structure. The first connecting portion 510 and the second connecting portion 610 are able to be snap-fastened to each other to keep the close fit between the first heat transfer surface 601 and the heat dissipation surface 501.

The hook structure is a structure capable of fitting the slot structure, and includes a hook capable of fitting the slot structure.

The slot structure is a structure capable of fitting the hook structure, and includes a slot capable of fitting the hook structure.

Stable connection can be implemented between the heat source 500 and the heat transfer block 600 through the snap-fit between the hook structure and the slot structure. In the above connected state, the first heat transfer surface 601 keeps in close fit with the heat dissipation surface 501. In this way, the heat of the heat source 500 can be stably and efficiently conducted to the heat transfer block 600, thereby increasing the heat dissipation capacity and heat dissipation efficiency of the heat source 500 and the nearby region.

In a possible embodiment, optionally, still referring to FIG. 3 and FIG. 4, the housing 400 includes a wall assembly 410. The wall assembly 410 wraps around to form a mounting through-hole 411. The heat transfer block 600 is disposed in the mounting through-hole 411. The wall assembly 410 is in close fit with an outer wall of the heat transfer block 600.

The wall assembly 410 is a combination of at least one wall forming the mounting through-hole 411. When the cross-section of the mounting through-hole 411 is a circular hole, the wall assembly 410 is a tubular wall. When the cross-section of the mounting through-hole 411 is rectangular, the wall assembly 410 is a combination of four walls.

The mounting through-hole 411 is a through-hole that runs through the housing 400 from inside to outside of the accommodation cavity 401.

The wall assembly 410 can limit the position of the heat transfer block 600, and prevent a displacement of the heat transfer block 600 from affecting the close fit between the first heat transfer surface 601 and the heat dissipation surface 501, thereby ensuring that the heat of the heat source 500 can be stably and efficiently conducted to the heat transfer block 600.

In a possible embodiment, optionally, the housing 400 further includes a bottom plate 420. The wall assembly 410 is disposed protrusively on the bottom plate 420.

The wall assembly 410 is a combination of at least one wall disposed protrusively on the bottom plate 420 and forming the mounting through-hole 411, and may be formed by connecting at least one wall sequentially.

Optionally, the height of the wall assembly 410 is the same as the height of the heat transfer block 600.

Optionally, the housing 400 is connected to the heat transfer block 600 by means of insert molding.

The wall assembly 410 is able to partially or fully fit a sidewall of the heat transfer block 600 closely. On the one hand, the close fit can further strengthen the effect of the wall assembly 410 in limiting the position of the heat transfer block 600. On the other hand, the close fit prevents the heat transfer block 600 from being electrically connected to another electrically conductive component in the accommodation cavity 401, obstructs the heat transfer block 600 from other components in the accommodation cavity 401, and prevents the heat from being conducted between the heat transfer block 600 and other components in the accommodation cavity 401 through the sidewall.

In a possible embodiment, optionally, the heat dissipation structure 30 includes two mounting through-holes 411 and two heat transfer blocks 600. The two heat transfer blocks 600 are disposed in the two mounting through-holes 411 respectively, and the two heat transfer blocks 600 are located at two ends of the heat source 500 respectively.

By distributing the two heat transfer blocks 600 at the two ends of the heat source 500 respectively and letting the first heat transfer surface 601 of each heat transfer block 600 fit the heat dissipation surface 501 of the heat source 500 closely, this application makes it convenient for the two heat transfer blocks 600 to conduct the heat at the two ends of the heat source 500 respectively, and avoids a local high temperature at the heat source 500 and the nearby region, thereby further increasing the heat dissipation capacity and heat dissipation efficiency of the heat source 500 and the nearby region.

In a possible embodiment, optionally, referring to FIG. 5, FIG. 5 is a cross-sectional view of a heat transfer block 600 according to some embodiments of this application. The heat transfer block 600 is a hollow structure.

The hollow structure means that the heat transfer block 600 is partially hollowed out, at least a part of the heat transfer block forms the second connecting hole 611, and at least another part of the heat transfer block is configured to exchange heat with another heat exchange component.

The hollow heat transfer block 600 reduces the weight of the heat dissipation structure 30 and reduces the cost.

The heat transfer block 600 includes a second connecting portion 610, a hollowed portion 620, and a heat exchange portion 630. The second connecting hole 611 is formed in the middle of the second connecting portion 610. The inner wall forming the second connecting hole 611 includes an internal thread. A region between the outer wall of the heat transfer block 600 and the inner wall forming the second connecting hole 611 is hollowed out. In the region of the hollowed portion 620, the region in the middle of the outer wall of the heat transfer block 600 is all hollowed out. The outer wall of the heat transfer block 600 extends outward to form the heat exchange portion 630 configured to exchange heat with another heat exchange component.

In a possible embodiment, optionally, referring to FIG. 6, FIG. 6 is a schematic structural diagram of another heat dissipation structure 30 according to some embodiments of this application. The heat dissipation structure 30 further includes a heat transfer plate 810. The heat transfer block 600 further includes a second heat transfer surface 602 located outside the accommodation cavity 401. The second heat transfer surface 602 is in close fit with the heat transfer plate 810.

The heat transfer plate 810 is a plate structure capable of heat exchange, and includes a relatively large heat exchange area.

Optionally, the heat transfer plate 810 is made of a material of a relatively high thermal conductivity. For example, the heat transfer plate 810 may be made of a simple-substance metal. The simple-substance metals include simple-substance aluminum, simple-substance copper, and the like.

After the heat of the heat source 500 is conducted to the heat transfer block 600, the heat transfer block 600 conducts the heat to the heat transfer plate 810 through the second heat transfer surface 602. In this way, the heat of the heat source 500 is conducted from inside of the accommodation cavity 401 to outside of the accommodation cavity 401, thereby reducing the temperature at the heat source 500 and the nearby region.

In a possible embodiment, optionally, the heat transfer block 600 is a columnar structure. The first heat transfer surface 601 and the second heat transfer surface 602 are located at two ends of the columnar structure respectively.

The heat of the heat source 500 is conducted to one end of the heat transfer block 600 through the heat dissipation surface 501 and the first heat transfer surface 601. The heat is conducted from one end to the other end of the heat transfer block 600, and then conducted to the heat transfer plate 810 through the second heat transfer surface 602.

Optionally, the heat transfer block 600 is a cuboid.

In a possible embodiment, optionally, a cooling flow channel that allows passage of a cooling liquid is disposed inside the heat transfer plate 810.

The cooling liquid is a fluid with a high specific heat capacity, and is in a liquid state at a normal temperature. For example, the cooling liquid may be water.

The cooling flow channel is a flow channel allowing passage of the cooling liquid and located inside the heat transfer plate 810. The cooling flow channel may be completely sealed during the molding or may include a cooling liquid inlet and a cooling liquid outlet.

After the heat of the heat source 500 is conducted to the heat transfer plate 810 through the heat transfer block 600, the heat can be exchanged with the cooling liquid in the cooling flow channel to reduce the temperature of the heat transfer plate 810.

In a possible embodiment, optionally, the heat dissipation structure 30 further includes a deformable heat transfer pad 820. The heat transfer pad 820 is disposed between the second heat transfer surface 602 and the heat transfer plate 810.

The heat transfer pad 820 is a deformable and thermally conductive pad, and is typically made of a deformable material of a relatively high thermal conductivity. For example, the heat transfer pad 820 may be made of thermally conductive silicone.

The heat transfer pad 820 ensures a stable fit between the heat transfer block 600, the second heat transfer surface 602, and the heat transfer plate, thereby facilitating heat transfer.

According to some embodiments of this application, still referring to FIG. 3 to FIG. 6, this application provides a high-voltage distribution box. The high-voltage distribution box includes the heat dissipation structure 30 disclosed in the preceding embodiment. The heat source 500 includes a first electrical connecting piece 910 and a second electrical connecting piece 920. The first electrical connecting piece 910 is connected to the second electrical connecting piece 920. The first electrical connecting piece 910 includes the heat dissipation surface 501.

The first electrical connecting piece 910 and the second electrical connecting piece 920 are electrically conductive components, and may be a flexible flat cable, a fuse, or a high-voltage copper busbar.

A relatively large amount of heat is generated at a region of junction between the first electrical connecting piece 910 and the second electrical connecting piece 920. Through the close fit between the first heat transfer surface 601 of the heat transfer block 600 and the heat dissipation surface 501 of the first electrical connecting piece 910, the heat generated at the region of junction between the first electrical connecting piece 910 and the second electrical connecting piece 920 is conducted to the heat transfer block 600. The heat transfer block 600 further conducts the heat out of the accommodation cavity 401, thereby reducing the temperature at the region of junction between the first electrical connecting piece 910 and the second electrical connecting piece 920.

In a possible embodiment, optionally, the second connecting portion 610 is a second connecting hole 611 located on the first heat transfer surface 601. The first electrical connecting piece 910 includes a third connecting hole 911. The second electrical connecting piece 920 includes a fourth connecting hole 921. The connecting piece 700 passes through the fourth connecting hole 921, the third connecting hole 911, and the second connecting hole 611 sequentially, and is in threaded fit with at least the second connecting hole 611 so that the first electrical connecting piece 910, the second electrical connecting piece 920, and the heat transfer block 600 are connected sequentially.

The third connecting hole 911 is a connecting hole with a diameter equal to or slightly greater than the outer diameter of the connecting piece 700, and is a through-hole running through the first electrical connecting piece 910.

The fourth connecting hole 921 is a connecting hole with a diameter equal to or slightly greater than the outer diameter of the connecting piece 700, and is a through-hole running through the second electrical connecting piece 920.

The connecting piece 700 is a structure of which one part is able to pass through the fourth connecting hole 921, the third connecting hole 911, and the second connecting hole 611 and another part is unable to pass through the fourth connecting hole 921, the third connecting hole 911 or the second connecting hole 611. The part unable to pass through the fourth connecting hole 921, the third connecting hole 911, or the second connecting hole 611 abuts on the second electrical connecting piece 920. The part able to pass through the fourth connecting hole 921, the third connecting hole 911, and the second connecting hole 611 includes an external thread. For example, the connecting piece 700 may be a bolt or a screw.

When the connecting piece 700 is a bolt, the bolt includes a head and a screw rod. The head is unable to pass through the fourth connecting hole 921, the third connecting hole 911, or the second connecting hole 611, and abuts on the second electrical connecting piece 920. The screw rod is able to pass through the fourth connecting hole 921, the third connecting hole 911, and the second connecting hole 611 to implement a threaded fit with at least the second connecting hole 611.

Optionally, the connecting piece 700 is in threaded fit with the second connecting hole 611 alone.

Optionally, the connecting piece 700 is in threaded fit with the second connecting hole 611 and the third connecting hole 911.

Optionally, the connecting piece 700 is in threaded fit with the second connecting hole 611 and the fourth connecting hole 921.

Optionally, the connecting piece 700 is in threaded fit with all the second connecting hole 611, the third connecting hole 911, and the fourth connecting hole 921.

Through the threaded fit of the connecting piece 700, the second electrical connecting piece 920 abuts on the first electrical connecting piece 910, the first electrical connecting piece 910 abuts on the heat transfer block 600, and the first heat transfer surface 601 keeps in close fit with the heat dissipation surface 501 stably.

In a possible embodiment, optionally, the first electrical connecting piece 910 is a fuse, and the second electrical connecting piece 920 is a high-voltage copper busbar.

A relatively large amount of heat is generated at the region of junction between the fuse and the high-voltage copper busbar. The heat transfer block 600 can conduct the heat out of the accommodation cavity 401, thereby reducing the temperature at the region of junction between the fuse and the high-voltage copper busbar.

According to some embodiments of this application, referring to FIG. 3 to FIG. 6, this application provides a high-voltage distribution box. The high-voltage distribution box includes: a housing 400, two heat transfer blocks 600, a fuse, two high-voltage copper busbars, two bolts, two heat transfer pads 820, and one heat transfer plate 810. The housing 400 forms an accommodation cavity 401. The housing 400 includes a bottom plate 420 and two wall assemblies 410. Each wall assembly 410 is disposed protrusively on the bottom plate 420. Each wall assembly 410 wraps around in the middle to form a mounting through-hole 411. Both heat transfer blocks 600 are cuboidal and made of simple-substance aluminum. Each heat transfer block 600 assumes a hollow structure. Two ends of each heat transfer block 600 are a first heat transfer surface 601 and a second heat transfer surface 602 respectively. Each heat transfer block 600 includes a second connecting hole 611 on the first heat transfer surface 601. The two heat transfer blocks 600 are disposed in the two mounting through-holes 411 respectively. In this way, the first heat transfer surface 601 is located in the accommodation cavity 401, and the second heat transfer surface 602 is exposed outside the shell. The heat transfer blocks 600 are connected to the housing 400 by means of insert molding. One fuse and two high-voltage copper busbars are disposed in the accommodation cavity 401. The fuse includes a heat dissipation surface 501. The fuse includes two third connecting holes 911. Each high-pressure copper busbar includes a fourth connecting hole 921. The two heat transfer blocks 600 are located at two ends of the heat source 500 respectively. A screw section of each bolt passes through the fourth connecting hole 921, the third connecting hole 911, and the second connecting hole 611 sequentially. In this way, the high-pressure copper busbars, the fuse, and the heat transfer blocks 600 are connected sequentially, and the first heat transfer surface 601 keeps in close fit with the heat dissipation surface 501. The second heat transfer surface 602 of the heat transfer block 600 is in close fit with the heat transfer plate 810 through the heat transfer pad 820. The heat transfer pad 820 is made of thermally conductive silicone. The heat transfer plate is made of simple-substance aluminum, and a cooling flow channel allowing passage of a cooling liquid is provided inside the heat transfer plate.

What is described above is merely exemplary embodiments of this application, but is not intended to limit this application. To a person skilled in the art, various modifications and variations may be made to this application. Any and all modifications, equivalent replacements, improvements, and the like made without departing from the spirit and principles of this application still fall within the protection scope of this application.

What is claimed is:

1. A heat dissipation structure, comprising:
a housing, configured to form an accommodation cavity, wherein the housing comprises a wall assembly, the wall assembly wraps around to form a mounting through-hole;
a heat source, wherein the heat source is disposed in the accommodation cavity, the heat source comprises a heat dissipation surface, and the heat source comprises a first connecting portion;
a heat transfer block inserted in the housing and disposed in the mounting through-hole, and the wall assembly is in close fit with an outer wall of the heat transfer block, the heat transfer block comprises at least one surface exposed outside the housing, the heat transfer block comprises a first heat transfer surface, and the heat transfer block comprises a second connecting portion; and
a heat transfer plate, the heat transfer block further comprises a second heat transfer surface located outside the accommodation cavity, and the second heat transfer surface is in close fit with the heat transfer plate;
wherein the first connecting portion is connected to the second connecting portion directly or through a connecting piece so that the first heat transfer surface keeps in close fit with the heat dissipation surface.

2. The heat dissipation structure according to claim 1, wherein the connecting piece passes through the first connecting portion and the second connecting portion to keep the close fit between the first heat transfer surface and the heat dissipation surface.

3. The heat dissipation structure according to claim 1, wherein the first connecting portion is a first connecting hole located on the heat dissipation surface, the second connecting portion is a second connecting hole located on the first heat transfer surface, and the connecting piece passes through the first connecting hole and the second connecting hole sequentially and is in threaded fit with at least the second connecting hole.

4. The heat dissipation structure according to claim 1, wherein the first connecting portion is a hook structure, the second connecting portion is a slot structure, and the first connecting portion and the second connecting portion are able to be snap-fastened to each other to keep the close fit between the first heat transfer surface and the heat dissipation surface.

5. The heat dissipation structure according to claim 1, wherein the housing further comprises a bottom plate, and the wall assembly is disposed protrusively on the bottom plate.

6. The heat dissipation structure according to claim 1, wherein the heat dissipation structure comprises two mounting through-holes and two heat transfer blocks, the two heat transfer blocks are disposed in the two mounting through-holes respectively, and the two heat transfer blocks are located at two ends of the heat source respectively.

7. The heat dissipation structure according to claim 1, wherein the heat transfer block is a hollow structure.

8. The heat dissipation structure according to claim 1, wherein the heat transfer block is a columnar structure, and the first heat transfer surface and the second heat transfer surface are located at two ends of the columnar structure respectively.

9. The heat dissipation structure according to claim 1, wherein a cooling flow channel that allows passage of a cooling liquid is disposed inside the heat transfer plate.

10. The heat dissipation structure according to claim 1, further comprising: a deformable heat transfer pad, and the heat transfer pad is disposed between the second heat transfer surface and the heat transfer plate.

11. A high-voltage distribution box, comprising:
the heat dissipation structure according to claim 1;
wherein the heat source comprises a first electrical connecting piece and a second electrical connecting piece, the first electrical connecting piece is connected to the second electrical connecting piece, and the first electrical connecting piece comprises the heat dissipation surface.

12. The high-voltage distribution box according to claim 11, wherein:
the second connecting portion is a second connecting hole located on the first heat transfer surface;
the first electrical connecting piece comprises a third connecting hole; the second electrical connecting piece comprises a fourth connecting hole; and
the connecting piece passes through the fourth connecting hole, the third connecting hole, and the second connecting hole, and is in threaded fit with at least the second connecting hole so that the first electrical connecting piece, the second electrical connecting piece, and the heat transfer block are connected sequentially.

13. The high-voltage distribution box according to claim 11, wherein the first electrical connecting piece is a fuse, and the second electrical connecting piece is a high-voltage copper busbar.

14. A battery, comprising the high-voltage distribution box according to claim 11.

15. An electrical device, comprising the battery according to claim 14, wherein the battery is configured to provide electrical energy.

* * * * *